(12) United States Patent
Tanaka et al.

(10) Patent No.: US 7,728,895 B2
(45) Date of Patent: Jun. 1, 2010

(54) SOLID-STATE IMAGE SENSING DEVICE HAVING SHARED FLOATING DIFFUSION PORTIONS

(75) Inventors: Shouzi Tanaka, Nara (JP); Ryouhei Miyagawa, Kyoto (JP); Kazunari Koga, Kyoto (JP); Takahiro Muroshima, Kyoto (JP); Kenji Watanabe, Osaka (JP)

(73) Assignee: Panasonic Corporation, Osaka (JP)

( * ) Notice: Subject to any disclaimer, the term of this patent is extended or adjusted under 35 U.S.C. 154(b) by 392 days.

(21) Appl. No.: 11/792,856

(22) PCT Filed: Jul. 11, 2006

(86) PCT No.: PCT/JP2006/013790

§ 371 (c)(1),
(2), (4) Date: Jun. 12, 2007

(87) PCT Pub. No.: WO2007/074549

PCT Pub. Date: Jul. 5, 2007

(65) Prior Publication Data

US 2008/0273105 A1   Nov. 6, 2008

(51) Int. Cl.
*H04N 3/15* (2006.01)
*H04N 5/335* (2006.01)

(52) U.S. Cl. .................................................. 348/302
(58) Field of Classification Search ............. 250/208.1; 257/291, 292; 348/294, 300, 301, 302, 308
See application file for complete search history.

(56) References Cited

U.S. PATENT DOCUMENTS

| | | | |
|---|---|---|---|
| 6,734,906 B1 | 5/2004 | Hashimoto | |
| 6,956,605 B1 | 10/2005 | Hashimoto | |
| 6,977,684 B1 | 12/2005 | Hashimoto et al. | |
| 2004/0159861 A1* | 8/2004 | Mori et al. | 257/223 |
| 2004/0218078 A1* | 11/2004 | Lee | 348/308 |
| 2005/0110885 A1* | 5/2005 | Altice et al. | 348/308 |
| 2005/0237405 A1* | 10/2005 | Ohkawa | 348/308 |
| 2006/0001751 A1 | 1/2006 | Abe et al. | |
| 2006/0017829 A1* | 1/2006 | Gallagher | 348/281 |
| 2006/0118837 A1* | 6/2006 | Choi | 257/291 |
| 2006/0119715 A1* | 6/2006 | Nam | 348/272 |
| 2006/0208285 A1* | 9/2006 | Inoue et al. | 257/239 |

FOREIGN PATENT DOCUMENTS

| | | |
|---|---|---|
| JP | 62-062690 | 3/1987 |
| JP | 11-331713 | 11/1999 |
| JP | 2000-012819 | 1/2000 |
| JP | 2000-059697 | 2/2000 |
| JP | 2000-078474 | 3/2000 |
| JP | 2004-172950 | 6/2004 |
| JP | 2005-167958 | 6/2005 |

* cited by examiner

*Primary Examiner*—Jason Whipkey
(74) *Attorney, Agent, or Firm*—McDermott Will & Emery LLP (57) ABSTRACT

A solid-state image sensing device includes: a plurality of unit pixels 21 arranged in rows and columns each of which outputs a pixel signal according to incident light; and a plurality of floating diffusion portions 22 each of which receives the pixel signals. Each of the floating diffusion portions 22 is shared by two unit pixels 21 which are respectively arranged in adjacent rows and which are respectively adjacent columns.

13 Claims, 8 Drawing Sheets

SOLID-STATE IMAGE SENSING DEVICE HAVING SHARED FLOATING DIFFUSION PORTIONS

RELATED APPLICATIONS

This application is the U.S. National Phase under 35 U.S.C. §371 of International Application No. PCT/JP2006/313790 filed on Jul. 11, 2006, which in turn claims the benefit of Japanese Application No. 2005-373180, filed on Dec. 26, 2005, the disclosure of which Applications are incorporated by reference herein.

TECHNICAL FIELD

The present invention relates to a solid-state image sensing device including a plurality of photoelectric conversion portions arranged in rows and columns and a method for driving the same.

BACKGROUND ART

In recent years, there is a growing demand for miniaturization of a MOS type solid-state image sensing device. At the same time, it is also necessary to realize high sensitivity. Therefore, it is required to increase the proportion of a photodiode (PD), which is a photoelectric conversion portion with respect to a pixel. For the above reason, the miniaturization of a floating diffusion (FD) portion, a reset transistor, a pixel amplifier transistor, and the like included in the pixel is advanced.

To further miniaturize a solid-state image sensing device, a configuration is proposed in which a plurality of PD portions share a FD portion and the like. For example, Patent Document 1 discloses a solid-state image sensing device including a pixel which has two or four PD portions and transfer read-out transistors, a FD portion, and a pixel amplifier transistor and a method for driving the same.

[Patent Document 1] Japanese Laid-Open Patent Publication No. 2005-167958

DISCLOSURE OF INVENTION

Problems to be Solved by the Invention

In the conventional solid-state image sensing device, since the transfer read-out transistors and the FD portion are provided in parallel with the PD portions, it is possible to reduce the number of the pixel amplifier transistors and the FD portions. However, there is a problem that the size of the FD portion can slightly be reduced. For example, the size of a FD portion shared with two PD portions is almost the same as that of a FD portion provided for a PD portion. Therefore, even in the configuration of connecting a plurality of PD portions to a common FD portion, the FD portion still occupies a large area, and thus there is a problem that a sufficiently large area can not be provided for the PD portions.

To solves the above-mentioned conventional problems, an object of the present invention is to realize a miniaturized and highly sensitive solid-state image sensing device which is configured such that when a plurality of photodiode portions share a floating diffusion portion, the proportion of the floating diffusion portion with respect to the photodiode portions is small.

Means for Solving the Problems

To achieve the above-mentioned object, a solid-state image sensing device of the present invention is configured such that a floating diffusion portion is shared by two photoelectric conversion portions which are respectively arranged in adjacent rows and which are respectively arranged in adjacent columns.

Specifically, a solid-state image sensing device of the present invention includes: a plurality of unit pixels arranged in rows and columns each of which outputs a pixel signal according to incident light; and a plurality of floating diffusion portions each of which receives the pixel signals, wherein every two of the unit pixels share a corresponding one of the floating diffusion portions, the two unit pixels being respectively arranged in adjacent rows of adjacent columns.

According to the solid-state image sensing device of the present invention, it is possible to arrange the FD portion diagonally to the pixels. This enables to reduce the area occupied by the FD portion compared to a case where a FD portion is arranged in parallel with pixels. Therefore, if the pixels have a uniform size, it is possible to increase the proportion of the photodiode portion with respect to the pixels. Moreover, it is possible to reduce the pixel size without reducing the area for the photodiode portion.

In the solid-state image sensing device of the present invention, it is preferable that each of the unit pixels includes: a photoelectric conversion portion which converts the incident light to the pixel signal; and a transfer read-out transistor which is connected to the photoelectric conversion portion to read out the pixel signal, and each of the floating diffusion portions is a drain region of the transfer-read-out transistor.

In the solid-state image sensing device of the present invention, it is preferable that every two of the unit pixels includes a pixel amplifier transistor which reads out the pixel signals accumulated in the corresponding one of the floating diffusion portions, and each of the floating diffusion portions is electrically connected to a corresponding one of the pixel amplifier transistors which reads out the pixel signal accumulated in the floating diffusion portion.

In the solid-state image sensing device of the present invention, it is preferable that each of the floating diffusion portions is electrically connected to another one of the floating diffusion portions, said each of the floating diffusion portions and said another one of the floating diffusion portions being adjacent to each other in the row direction, and each of pairs of the floating diffusion portions electrically connected with each other is electrically connected to a common one of the pixel amplifier transistors. In this configuration, it is possible to share each pixel amplifier transistor and the like, which makes it possible to improve the occupation ratio of the photodiode portion.

It is preferable that the solid-state image sensing device of the present invention further includes plurality of vertical signal lines each of which is provided for each column and electrically connected to each of the floating diffusion portions via the corresponding one of the pixel amplifier transistors, wherein each of the vertical signal lines receives the pixel signals of the unit pixels arranged in an odd-numbered row among the unit pixels arranged in a corresponding one of the columns and another one of the other vertical signal lines adjacent to said each of the vertical signal lines receives the pixel signals of the unit pixels arranged in an even-numbered row among of a corresponding one of the columns and the pixel signals of the unit pixels arranged in an odd-numbered row of one of the other columns adjacent to said corresponding one of the columns.

It is preferable that the solid-state image sensing device of the present invention further includes a signal processing section which successively reads out the pixel signals from the plurality of vertical signal lines and converts the pixel signals to an image sensing signal of one row; and a horizontal scan circuit which outputs a horizontal drive signal to drive the signal processing section, wherein the horizontal scan circuit outputs the horizontal drive signal which has different timings for a case where the signal processing section reads out the pixel signals of the unit pixels arranged in the even-numbered row and for a case where the signal processing section reads out the pixel signals of the unit pixels arranged in the odd-numbered row. In this configuration, it is possible to suppress the occurrence of a misalignment of images even in a case where the FD portion is diagonally arranged.

In the solid-state image sensing device of the present invention, it is preferable that the horizontal scan circuit includes a plurality of shift register circuits and a selection circuit, the selection circuit selects an one of output signals of any one of the plurality of shift register circuits and outputs the selected output signal as the horizontal drive signal, and the shift register circuits generate the output signals which have timings different being shifted from each other.

In the solid-state image sensing device of the present invention, it is preferable that the horizontal scan circuit includes a shift register circuit which has a plurality of stages of flip-flops serially connected with each other, and the stages of the flip-flops to which a signal is input are different for a case where the signal processing section reads out the pixel signals of the unit pixels arranged in the even-numbered row and for a case where the signal processing section reads out the pixel signals of the unit pixels arranged in the odd-numbered row. This configuration includes only one shift register circuit, which allows miniaturization of the device.

In this case, it is preferable that the horizontal scan circuit includes a selection circuit which switches the stages of the flip-flops to which the signal is input.

It is preferable that the solid-state image sensing device of the present invention further includes a determination circuit which determines whether the pixel signals read out by the signal processing section are the pixel signals from the unit pixels arranged in the even-numbered row or the pixel signals from the unit pixels arranged in the odd-numbered row to drive the selection circuit.

It is preferable the solid-state image sensing device of the present invention further includes a vertical scan circuit which outputs a vertical drive signal to bring the plurality of unit pixels into a selected state on a row-by-row basis, wherein the determination circuit operates according to the vertical drive signal.

In the solid-state image sensing device of the present invention, it is preferable that the horizontal scan circuit includes a shift register circuit which is driven by a shift register drive signal, and the shift register circuit is driven by the shift register drive signal which has different timings for a case where the signal processing section reads out the pixel signals of the unit pixels arranged in the even-numbered row and for a case where the signal processing section reads out the pixel signals of the unit pixels arranged in the odd-numbered row.

A method for driving a solid-state image sensing device of the present invention is aimed at a solid-state image sensing device including a plurality of unit pixels arranged in rows and columns each of which outputs a pixel signal according to incident light; a plurality of floating diffusion portions to each of which the pixel signals are transferred, is shared by every two of the unit pixels sharing a corresponding one of the floating diffusion portions, and the two unit pixels being respectively arranged in adjacent rows of adjacent columns; a plurality of vertical signal lines each of which is provided for each column and connected to each of the floating diffusion portions; and a horizontal signal line which is connected to each of the vertical signal lines and to which the pixel signals are successively read out, the method comprising the steps of: (a) generating an image sensing signal of a row, in such a manner that and (b) generating an image sensing signal of another row adjacent to the row of step (a) in such a manner that wherein step (a) includes (a1) respectively transferring the pixel signals of the unit pixels arranged in the row of step (a) are respectively transferred to corresponding each of the floating diffusion portions, then (a2) respectively outputting the pixel signals transferred to the floating diffusion portions are respectively output to corresponding each of the vertical signal lines, and (a3) successively reading out the pixel signals output to the vertical signal lines are successively read out to the horizontal signal line, and step (b) includes (b1) respectively transferring the pixel signals of the unit pixels arranged in said another row are respectively transferred to corresponding each of the floating diffusion portions, then (b2) respectively outputting the pixel signals transferred to the floating diffusion portions are respectively output to corresponding each of the vertical signal lines, and (b3) successively reading out the pixel signals output to the vertical signal lines are successively read out to the horizontal signal line, wherein step (b3) includes initiating reading-out of the pixel signals from the vertical signal line which is different from the vertical signal line at which reading-out of the pixel signals to the horizontal signal line is initiated in step (a3).

According to the method for driving a solid-state image sensing device of the present invention, a vertical signal line which initiates reading-out of the pixel signals of a row to the horizontal signal line is different from a vertical signal line which initiates reading-out of the pixel signals of another row adjacent to the row to the horizontal signal line. In this configuration, an image sensing signal without misalignment of images can be obtained from the solid-state image sensing device in which the FD portion is diagonally arranged.

EFFECTS OF THE INVENTION

According to a solid-state image sensing device of the present invention, it is possible to realize a miniaturized and highly sensitive solid-state image sensing device which is configured such that when a plurality of photodiode portions share a floating diffusion portion, the proportion of the floating diffusion portion with respect to the photodiode portions is small.

DESCRIPTION OF REFERENCE NUMERALS

11 Photodiode Portion
12 Read-Out Transistor
15 Well
16 Device Isolation Section
20 Photoelectric Conversion Cell Section
21 Unit Pixel
22 Floating diffusion Portion
23 Reset Transistor
24 Pixel Amplifier Transistor
31 Vertical Signal Line
32 Reset Signal Line
33 Read-Out Signal Line
34 Power Supply Signal Line
35 Horizontal Signal Line
41 Vertical Scan Circuit
42 Signal Processing Section
43 Horizontal Scan Circuit
44 Signal Amplifier Circuit
51 Shift Register Circuit
52 Shift Register Circuit
53 Determination circuit
54 Selection Circuit
55 Shift Register Circuit
56 Selection Circuit

BEST MODE FOR CARRYING OUT THE INVENTION

Embodiment 1

Figure 1:
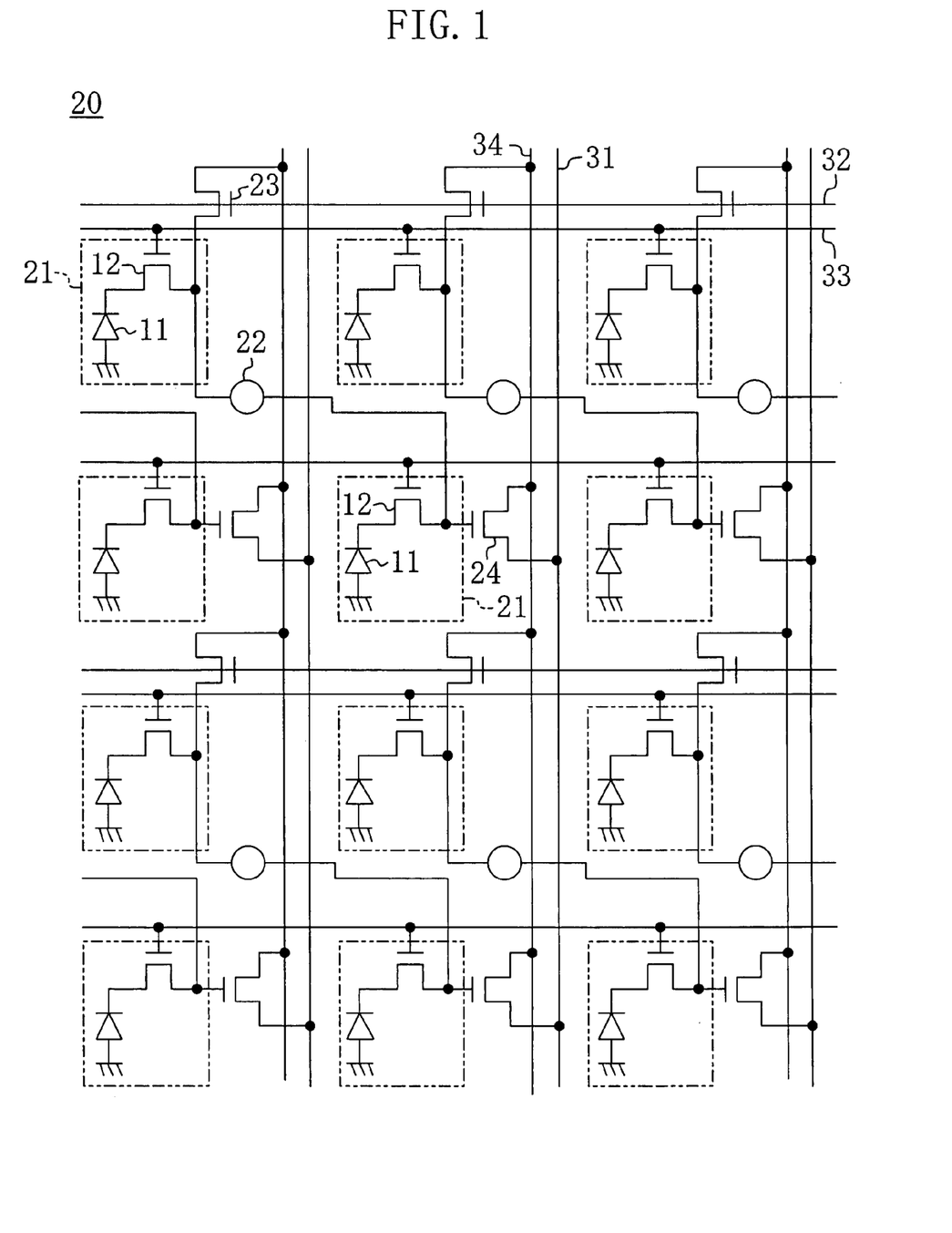
FIG. 1 is a circuit diagram illustrating a circuit configuration of a photoelectric conversion cell section of a solid-state image sensing device of Embodiment 1 of the present invention.

Embodiment 1 of the present invention will be described with reference to the drawings. FIG. 1 shows a circuit configuration of a photoelectric conversion cell section 20 included in a solid-state image sensing device of Embodiment 1 of the present invention, As shown in FIG. 1, the photoelectric conversion cell section 20 includes unit pixels 21, floating diffusion (FD) portions 22, reset transistors 23, and pixel amplifier transistors 24. The unit pixels 21 are arranged in rows and columns. Each of the FD portions 22 is provided between two unit pixels 21. Each of the reset transistors 23 has the source and the drain one of which is connected to the FD portion 22. Each of the pixel amplifier transistors 24 has the gate connected to the FD portion 22. In FIG. 1, the unit pixels are arranged in four rows and three columns. However, the numbers of rows and columns in which the unit pixels 21 are arranged in the photoelectric conversion cell section 20 may by arbitrarily changed.

Each of the unit pixels 21 includes a photodiode (PD) portion 11 and a read-out transistor 12. The read-out transistor 12 has the source and the drain one of which is connected to the PD portion 11. The read-out transistors 12 respectively provided in two unit pixels 21 which are respectively arranged in adjacent rows and which are respectively arranged in adjacent columns are connected with each other to share the other one of the source and the drain thereof, which forms the FD portion 22. Each of the pixel amplifier transistors 24 has the source and the drain one of which is connected to a vertical signal line 31 provided for each column. The other one of the source and the drain of each of the pixel amplifier transistors 24 and the other one of the source and the drain of each of the reset transistors 23 are respectively connected to power supply signal lines 34. Each of the reset transistors 23 has the gate connected to a reset signal line 32 provided for each row, and each of the read-out transistors 12 has the gate connected to a readout signal line 33 provided for each row.

Figure 2:
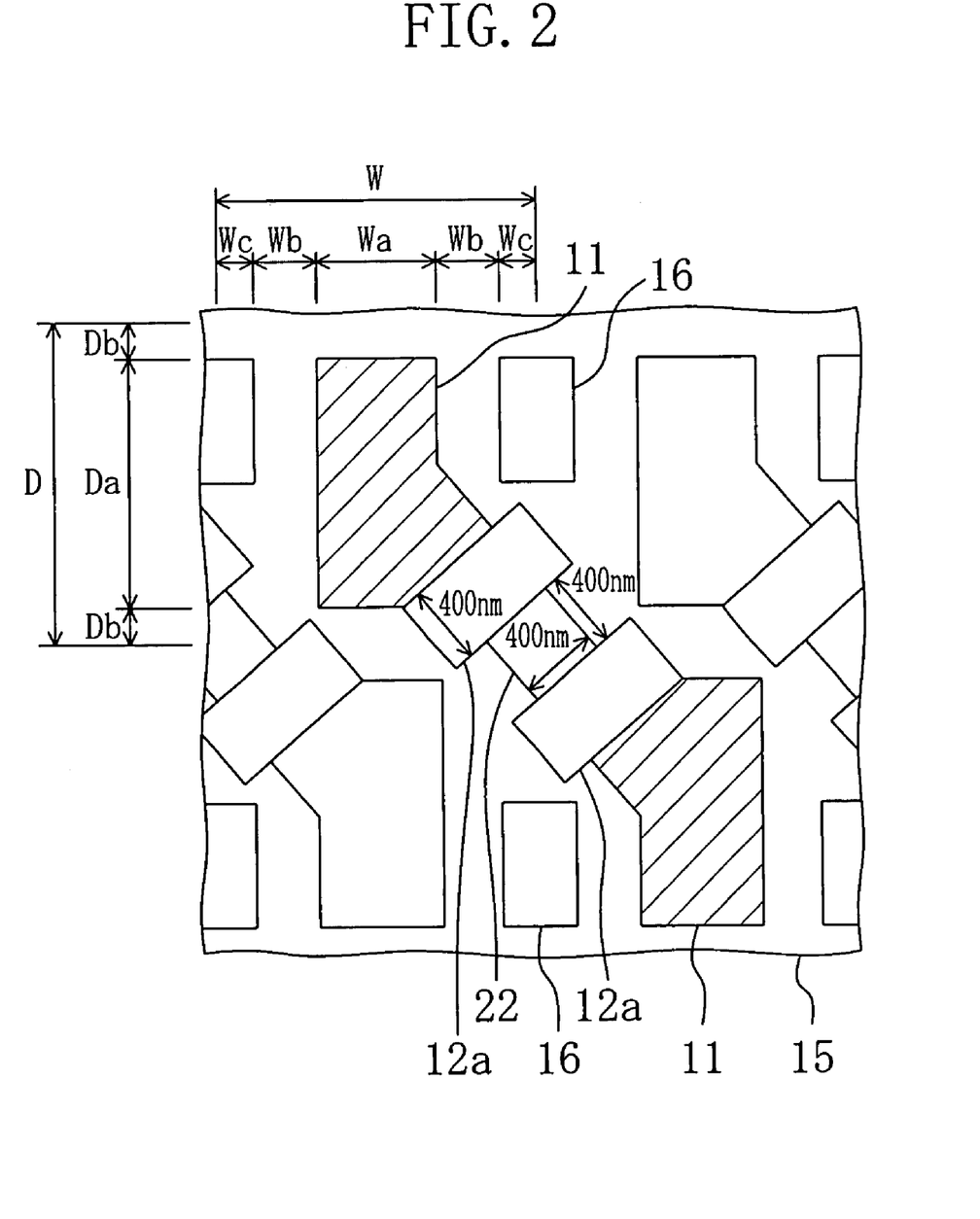
FIG. 2 is a plan view illustrating a layout configuration of the photoelectric conversion cell section of the solid-state image sensing device of Embodiment 1 of the present invention.

FIG. 2 shows an exemplary arrangement of the unit pixels 21 and the FD portion 22 on a substrate according to the circuit configuration of FIG. 1. In an well 15 of the substrate, the PD portions 11 are formed in rows and columns. The FD portion 22 is formed between the PD portions 11 which are respectively arranged in adjacent rows and which are respectively arranged in adjacent columns. Between the FD portion 22 and each PD portions 11, gates 12a of the read-out transistors are respectively formed, so that the FD portion 22 forms a drain region of the read-out transistors. The gates 12a of the read-out transistors and the FD portion 22 are formed diagonally to the PD portions 11. This makes it possible to significantly reduce the area of the FD portion 22.

For example, assuming that the width W in the column direction and the width D in the row direction are respectively 1800 nm, the width 2Wc of a device isolation section 16 is 350 nm, and the distance Wb between the device isolation section 16 and the PD portion 11 is 350 nm, the width Wa of the PD portion 11 in the column direction is 750 nm. Moreover, assuming that the distance 2Db between the PD portions 11 adjacent to each other in the row direction is 350 nm, the width Da of the PD portion 11 in the row direction is 1100 nm. In this case, assuming that the gate length of the gate 12a of the transfer read-out transistor is 400 nm, the FD portion 22 is a square of about 400 nm on a side and has an area of about 0.16 $\mu m^2$. Since the unit area is about 3.2 $\mu m^2$, the proportion of the FD portion 22 per unit area is about 5%. Moreover, assuming that the distance Db between the PD portions 11 in the column direction is 350 nm, the area of each PD portion 11 shaded in FIG. 2 is about 1.1 $\mu m^2$. Therefore, the proportion of the PD portion 11 per unit area is about 35%.

Figure 3:
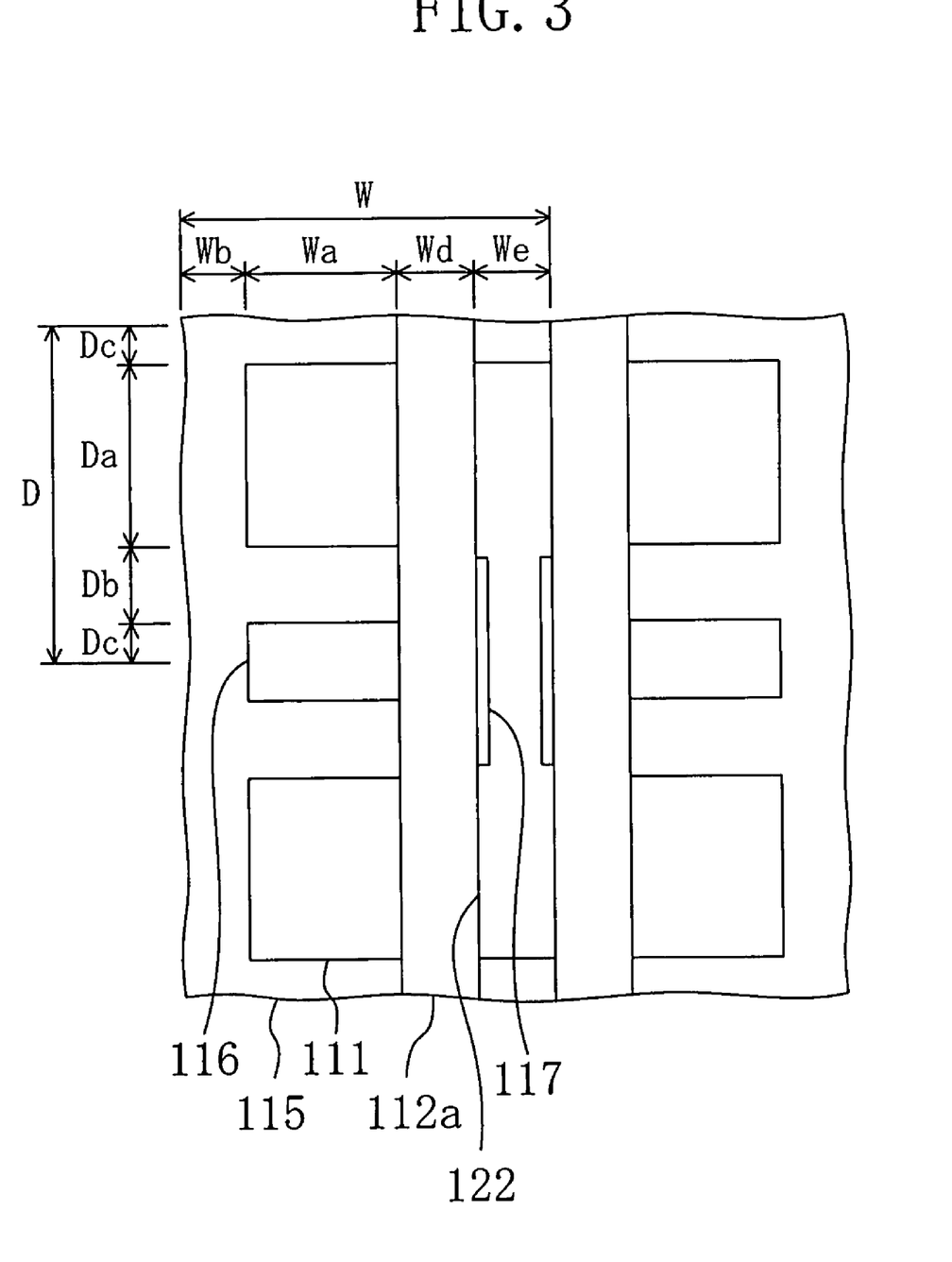
FIG. 3 is a plan view with reference to which a description is provided of the area of a FD portion in a conventional solid-state image sensing device.

FIG. 3 shows a layout in which a FD portion 122 is formed between PD portions 111 which are respectively provided in adjacent rows and which are provided in the same column. Also in this case, it is assumed that the unit area is defined by the width W in the column direction and the width D in the row direction which are respectively 1800 nm. In such a unit area, assuming that the width 2Dc of a device isolation section 116 in the row direction is set to 350 nm, the distance Db between the device isolation section 116 and the PD portion 111 is set to 350 nm, and the distance Wb between the PD portions 111 in the column direction is set to 350 nm, the FD portion 122 has a width We of 200 nm, a length of 3250 nm, and an area of about 0.65 $\mu m^2$. The proportion of the FD portion 122 per unit area is about 20%, which is far greater than that of the FD portion 22 which is diagonally arranged. In this case, it is necessary to form isolation oxide films 117 under gates 112a of read-out transistors, which produces a narrow part in the FD portion 122. Since a wiring contact has to be formed in the narrow part, it is difficult to further narrower the width We of the FD portion 122. Meanwhile, the area of the PD portions 111 is 0.9 μm², and thus the proportion of the PD portion 111 per unit area is about 29%.

As described above, when pixels are designed according to the same design rule, diagonally arranging the read-out transistors and the FD portion greatly reduces the area occupied by the FD portion, which makes it possible to greatly improve the area provided for the PD portion.

Variation of Embodiment 1

Figure 4:
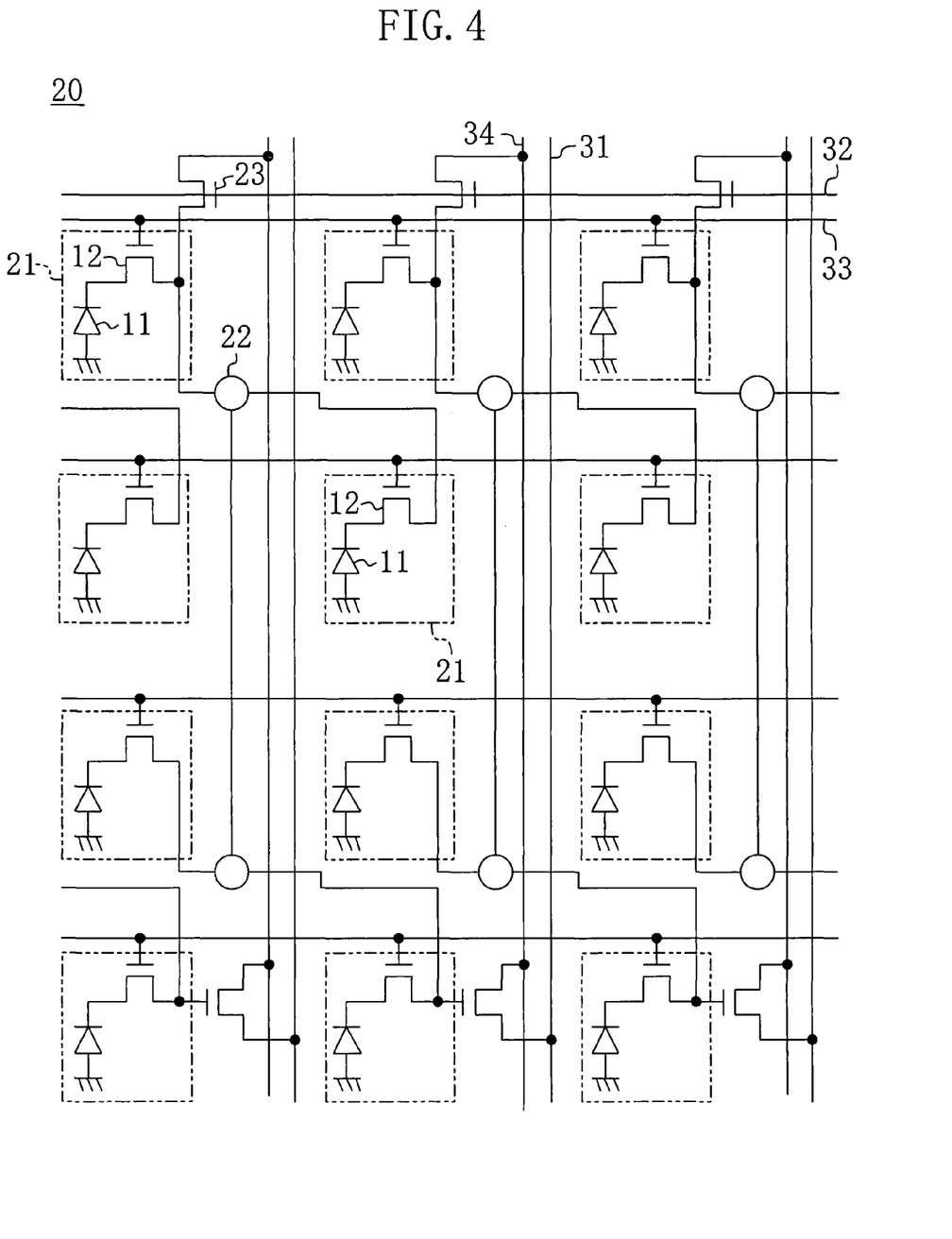
FIG. 4 is a circuit diagram illustrating a circuit configuration of a photoelectric conversion cell section of a solid-state image sensing device of a variation of Embodiment 1 of the present invention.

A variation of Embodiment 1 will be described below with reference to the drawings. FIG. 4 shows a circuit configuration of a solid-state image sensing device of the variation of Embodiment 1. In FIG. 4, components which are the same as those of FIG. 1 are given the same reference numerals and descriptions thereof are omitted.

As shown in FIG. 4, in the solid-state image sensing device of the present variation, two FD portions 22 which are provided in the same column and which are respectively provided in adjacent rows are electrically connected with each other and share the reset transistor 23 and the pixel amplifier transistor 24.

In this configuration, it is possible to reduce the number of the reset transistors 23 and the pixel amplifier transistors 24, which is advantageous for further miniaturization of the solid-state image sensing device.

Embodiment 2

Figure 5:
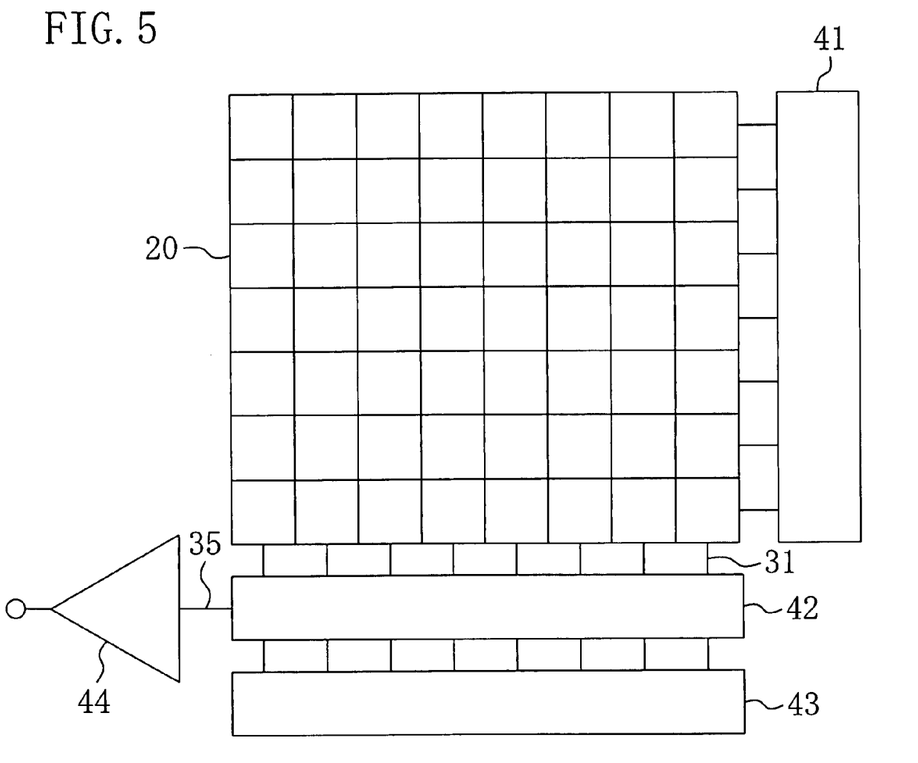
FIG. 5 is a block diagram illustrating a circuit configuration of a solid-state image sensing device of Embodiment 2 of the present invention.

Embodiment 2 of the present invention will be described below with reference to the drawings. FIG. 5 is a block diagram illustrating a configuration of a solid-state image sensing device of Embodiment 2 of the present invention.

As shown in FIG. 5, the solid-state image sensing device of Embodiment 2 includes: a photoelectric conversion cell section 20; a vertical scan circuit 41 which drives the photoelectric conversion cell section 20 on a row-by-row basis; a signal processing section 42 which processes and holds an output signal of the photoelectric conversion cell section 20; and a horizontal scan circuit 43 which drives the signal processing section on a column-by-column basis.

The circuit configuration of the photoelectric conversion cell section 20 is the same as that of the photoelectric conversion cell section 20 of Embodiment 1 of FIG. 1, and two unit pixels 21 which are respectively arranged in adjacent rows and which are respectively arranged in adjacent columns share the FD portion 22. The FD portion 22 is connected via the pixel amplifier transistor 24 to the vertical signal line 31 provided for each column.

The vertical scan circuit 41 outputs a vertical drive signal to select one of rows of the photoelectric conversion cell section 20, and pixel signals of the unit pixels 21 included in the selected row are respectively output to the vertical signal lines 31 via the FD portions 22 and the pixel amplifier transistors 24. The vertical drive signal is a pulse signal which is supplied to, for example, the read-out signal line 33, the reset signal line 32, and the power source signal line 34.

The pixel signals respectively output to the vertical signal lines 31 are held in the signal processing section 42. The pixel signals held in the signal processing section 42 are successively read out to a horizontal signal line 35 according to a horizontal drive signal which is output form the horizontal scan circuit 43 and output as an image sensing signal of one row via a signal amplification circuit 44 connected to the horizontal signal line 3S.

In the photoelectric conversion cell section 20 of Embodiment 2, as shown in FIG. 1, two unit pixels 21 which are respectively included in adjacent rows and which are included in the same column share the FD portions 22 with other unit pixels 21 included in columns opposite to each other. Specifically, in FIG. 1, a unit pixel 21 in the first row, second column shares a FD portion 22 with a unit pixel 21 in the second row, first third column, and a unit pixel 21 in the second row, second column shares a FD portion 22 with a unit pixel 21 in the first row, third first column. Moreover, the FD portion 22 in the first row, second column is connected to a vertical signal line 31 provided for the second first column, and the FD portion 22 in the second row, second column is connected to a vertical signal line 31 provided for the third second column. Therefore, the pixel signals of the unit pixels 21 in a column are respectively output to different vertical signal liens 31 for a case of an odd-numbered row or for a case of an even-numbered row. Therefore, if the pixel signals held in the signal processing section 42 are merely read out to the horizontal signal line 35 to generate an image sensing signal of one row, there is a possibility that a misalignment of images may occur between the case of the odd-numbered row and the case of the even-numbered row.

Figure 6:
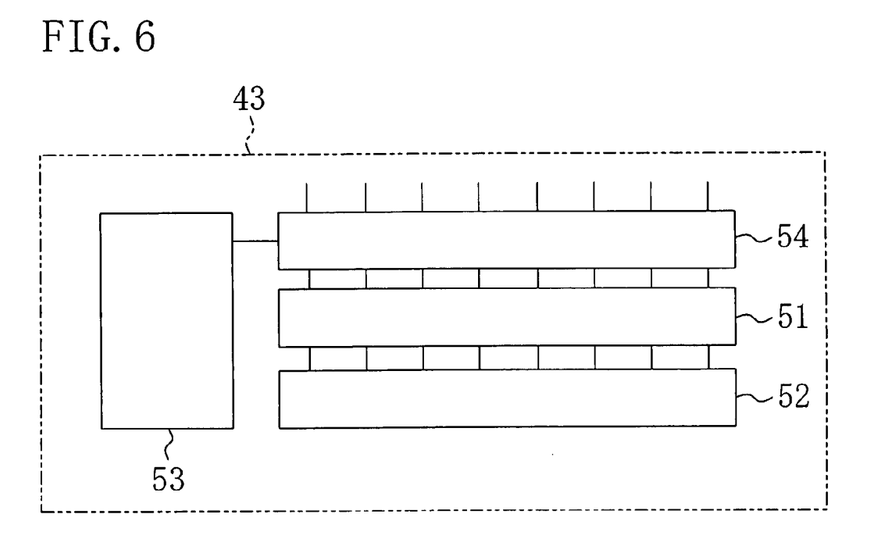
FIG. 6 is a block diagram illustrating an exemplary horizontal scan circuit of the solid-state image sensing device of Embodiment 2 of the present invention.

According to the solid-state image sensing device of Embodiment 2, as shown in FIG. 6, the horizontal scan circuit 43 includes two types of shift register circuits, i.e., a shift register circuit 51 and a shift register circuit 52, which makes it possible to generate two types of horizontal drive signals. A determination circuit 53 drives a selection circuit 54 such that a horizontal drive signal generated by the shift register circuit 51 or a horizontal drive signal generated by the shift register circuit 52 is output and supplied to the signal processing section 42. In this way, timing at which the pixel signals are read out from the signal processing section 42 to the horizontal signal line 35 can be changed for the odd-numbered row and the even-numbered row. As a result, even in a case where unit pixels 21 which are respectively in adjacent rows and which are respectively in adjacent columns share a FD portion 22, it is possible to suppress the occurrence of the misalignment of images.

Figure 7:
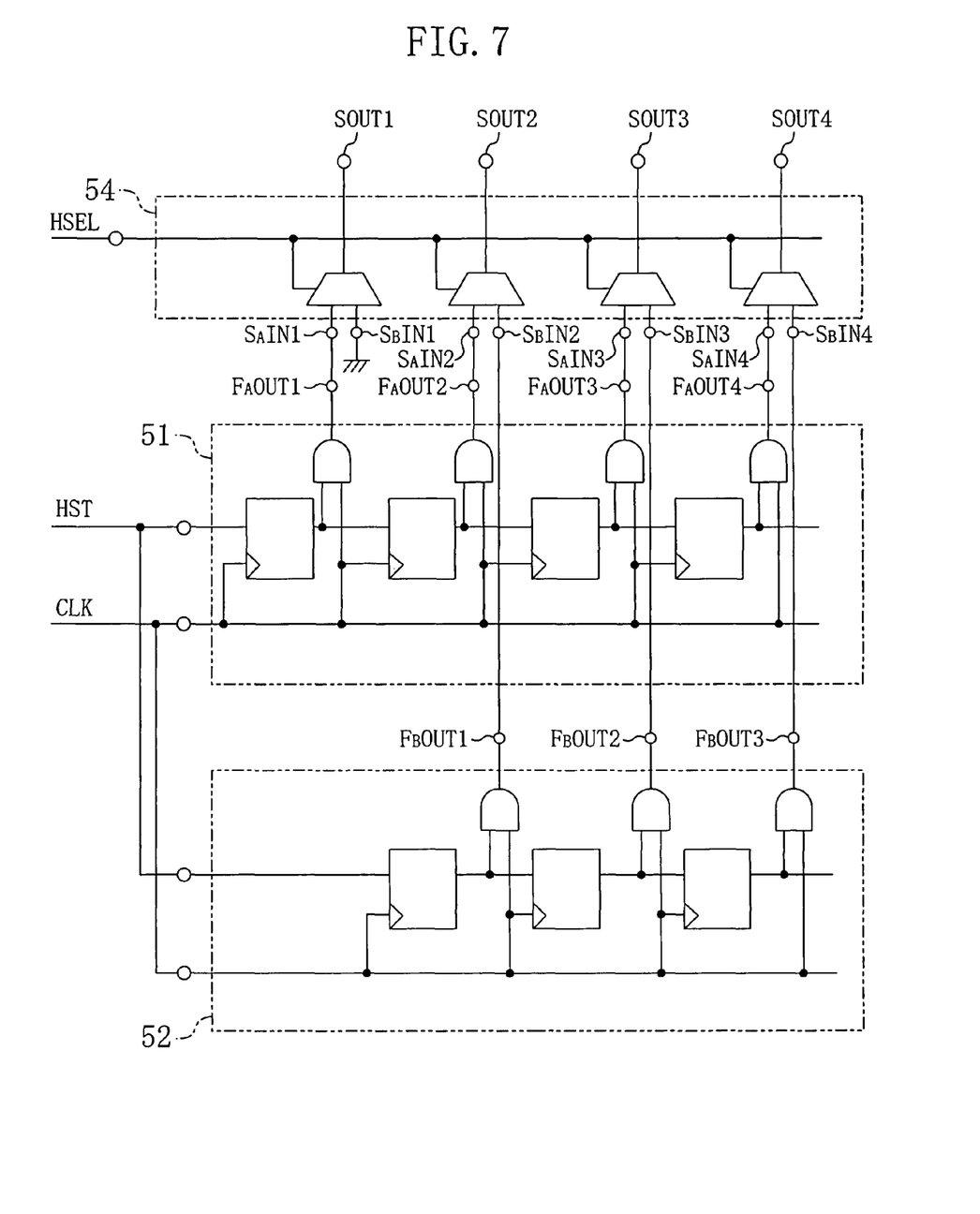
FIG. 7 is a circuit diagram illustrating the exemplary horizontal scan circuit of the solid-state image sensing device of Embodiment 2 of the present invention.

FIG. 7 shows an exemplary circuit configuration of the horizontal scan circuit of Embodiment 2. According to a signal via a determination signal line HSEL, the selection circuit 54 selects a signal input via first input terminals $S_A IN$ or a signal input via second input terminals $S_B IN$ and outputs the selected signals via output terminals SOUT.

The shift register circuit 51 and the shift register circuit 52 include a plurality of stages of flip-flops serially connected with each other. An output terminal $F_A OUT1$ of a first stage in the shift register circuit 51 is connected to a first input terminal $S_A IN1$ of a first stage in the selection circuit 54, and output terminals $F_A OUT$ of the second and succeeding stages are successively connected to corresponding first input terminals $S_A IN$. An output terminal $F_B OUT1$ of a first stage in the shift register 52 is connected to a second input terminal $S_B IN2$ of a second stage in the selection circuit 54, and output terminals $F_B OUT$ of a second and succeeding stages are connected to second input terminals $S_B IN$ successively from a third stage in the selection circuit 54. A second input terminal $S_B IN1$ of the first stage in the selection circuit 54 is connected to the ground.

Signal input terminals and clock terminals of the first stages of the shift register circuit 51 and the shift register circuit 52 are respectively connected to a shift register drive line HST and a clock line CLK. A shift register drive pulse applied to the shift register drive line HST is successively shifted by the shift register circuit 51 and the shift register circuit 52 and output in synchronization with a drive clock input to the clock terminal.

Figure 8A:
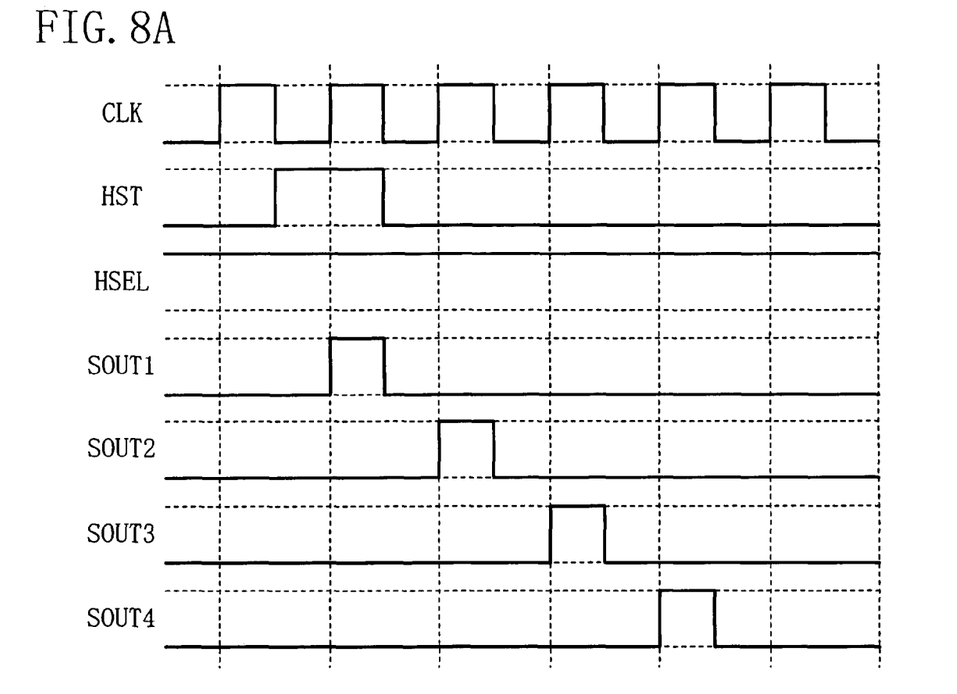
FIG. 8 is a timing chart illustrating timing for operating the horizontal scan circuit of the solid-state image sensing device of Embodiment 2 of the present invention.
Figure 8B:
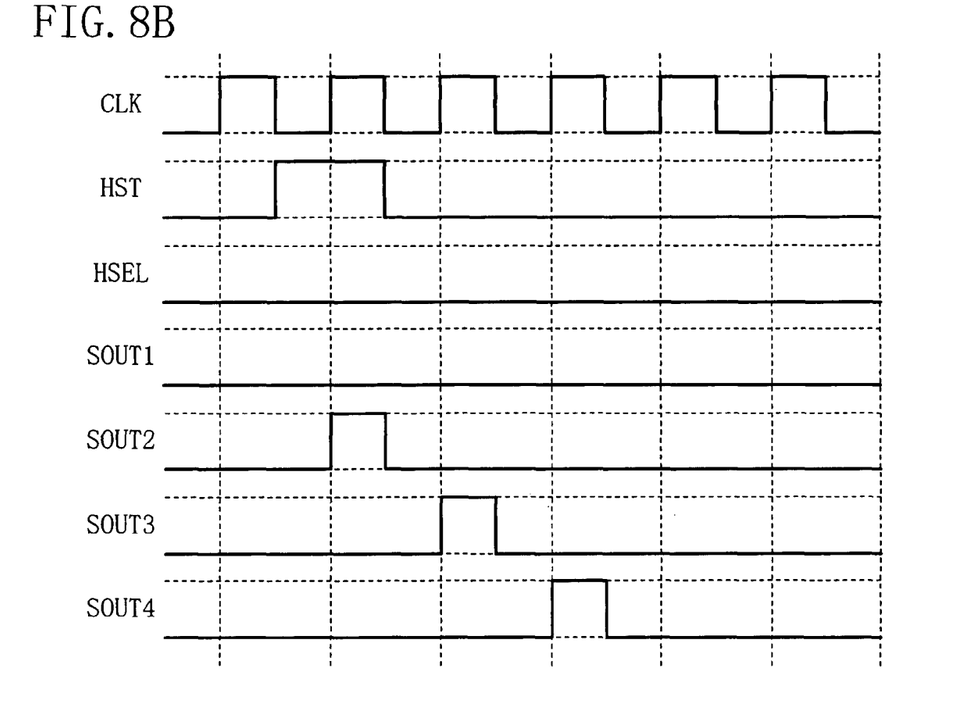

FIG. 8A and FIG. 8B show operation timing of the horizontal scan circuit of FIG. 7, wherein FIG. 8A shows a case where read-out operation is performed on the odd-numbered row and FIG. 8B shows a case where the read-out operation is performed on the even-numbered row. When the read-out operation is performed on the odd-numbered row, a high ("H") level voltage is applied to the determination signal line HSEL. As a result, the signal input to the first input terminals $S_A$IN of the selection circuit 54 is output from the output terminals SOUT of the selection circuit 54.

When a shift pulse is applied to the shift register circuit 51, the output terminals $F_A$OUT of the shift register circuit 51 output an "H" level signal successively from the first stage in synchronization with the drive clock, so that the "H" level signal is output successively from the output terminal SOUT1 of the first stage in the selection circuit 54. Therefore, the signals which are accumulated in the signal processing section 42 are read out to the horizontal signal line 35 successively from the vertical signal line 31 provided for the first column, and then are successively output via the signal amplifier circuit 44.

Meanwhile, when the read-out operation is performed on the even-numbered row, a low ("L") level voltage is applied to the determination signal line HSEL. As a result, the signal input in the second input terminals $S_B$IN of the selection circuit 54 is output from the output terminals SOUT of the selection circuit 54. Since the output terminal $F_B$OUT1 of the first stage in the shift register circuit 52 is connected to the second input terminal $S_B$IN2 of the second stage in the selection circuit 54, the "H" level signal is output successively from the second output terminal SOUT2 of the second stage in the selection circuit 54. Therefore, the signals which are accumulated in the signal processing section 42 are read out to the horizontal signal line 35 successively from the vertical signal line 31 provided for the second column, and then are successively output via the signal amplifier circuit 44.

In a case where a FD portion 22 is shared by two unit pixels 21 which are respectively arranged in adjacent rows and which are respectively arranged in adjacent columns, the pixel signal of the unit pixel 21 which is arranged in a nth column (where n is an integer equal to or greater than 1) and which is arranged in the odd-numbered row is output to the vertical signal line 31 provided for the nth column, and the pixel signal of the unit pixel 21 which is arranged in the nth column and which is arranged in the even-numbered row is output to the vertical signal line 31 provided for a (n+1)th column. Even in this case, the read-out timing to the horizontal signal line 35 does not vary, and it is possible to suppress the occurrence of misalignment of images.

Figure 9:
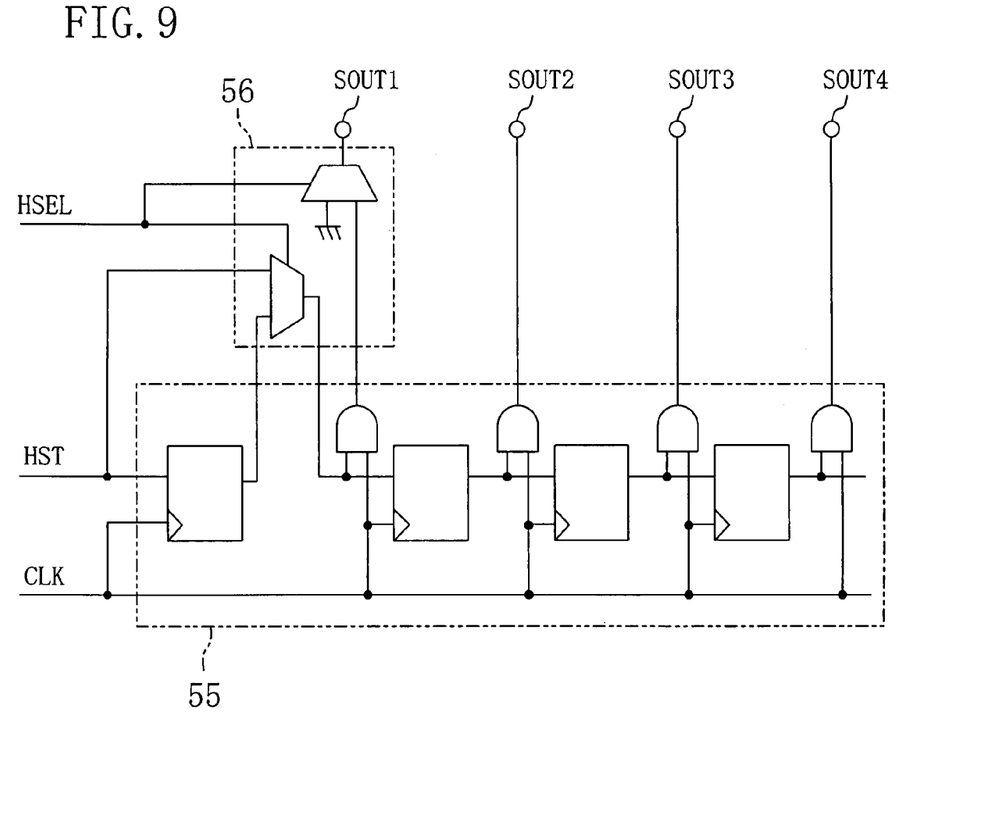
FIG. 9 is a circuit diagram illustrating another exemplary horizontal scan circuit of the solid-state image sensing device of Embodiment 2 of the present invention.

FIG. 9 shows another configuration of the horizontal scan circuit of Embodiment 2. As shown in FIG. 9, the horizontal scan circuit includes a shift register circuit 55 composed of a plurality of stages of flip-flops serially connected with each other, and a selection circuit 56. When the read-out operation is performed on the odd-numbered row, the shift pulse applied to the shift register drive line HST is input to a first stage of the shift register circuit 55. When the read-out operation is performed on the even-numbered row, the selection circuit 56 is driven to input the shift pulse to a second stage of the shift register 55. This configuration includes only one shift register circuit, which makes it possible to simplify the circuit configuration.

Figure 10:
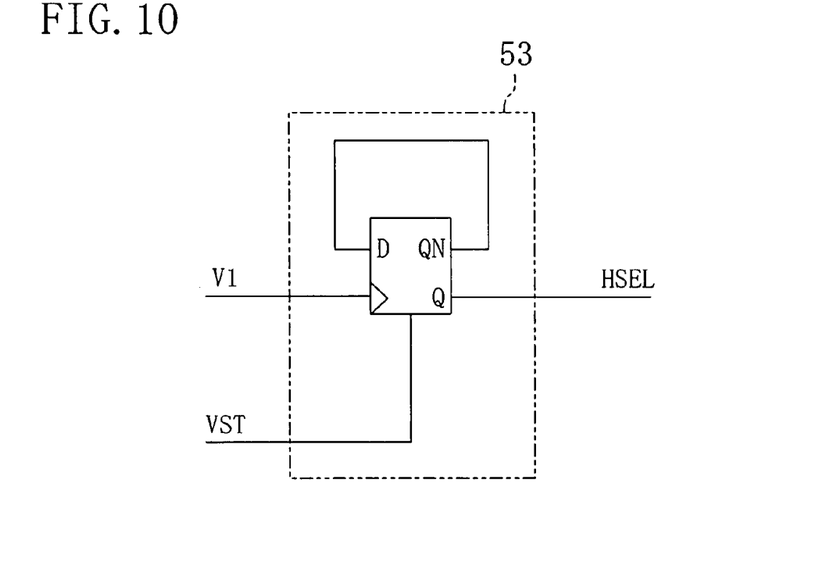
FIG. 10 is a circuit diagram illustrating an exemplary determination circuit of the solid-state image sensing device of Embodiment 2 of the present invention.

The determination circuit 53 may be a divide-by-2 circuit to which an input D and an inverted output QN of a flip-flop are connected as shown in FIG. 10. Here, a shift pulse for the vertical scan circuit 41 is applied via a line VST, and a drive clock for the vertical scan circuit 41 is applied via a line V1. Therefore, when the vertical scan circuit 41 selects the odd-numbered row for the read-out operation, the voltage of the determination signal line HSEL connected to an output Q of the flip-flop changes to the "H" level, and when the vertical scan circuit 41 selects the even-numbered row for the read-out operation, the voltage of the determination signal line HSEL changes to the "L" level.

INDUSTRIAL APPLICABILITY

According to a solid-state image sensing device and a method for driving the same according to the present invention, the proportion of the floating diffusion portion with respect to the photodiode portions is small when a plurality of photodiode portions share a floating diffusion portion, and it is possible to realize miniaturized and highly sensitive solid-state image sensing device. Therefore, the solid-state image sensing device and a method for driving the same according to the present invention are applicable to, for example, a solid-state image sensing device including a plurality of photoelectric conversion portions arranged in rows and columns and a method for driving the same.

The invention claimed is:

1. A solid-state image sensing device comprising:
a plurality of unit pixels arranged in rows and columns each of which outputs a pixel signal according to incident light; and
a plurality of floating diffusion portions each of which receives the pixel signals,
wherein every two of the unit pixels share a corresponding one of the floating diffusion portions, the two unit pixels being respectively arranged in adjacent rows of adjacent columns.

2. The solid-state image sensing device of claim 1, wherein each of the unit pixels includes:
a photoelectric conversion portion which converts the incident light to the pixel signal; and
a read-out transistor which is connected to the photoelectric conversion portion to read out the pixel signal, and
each of the floating diffusion portions is a drain region of the read-out transistor.

3. The solid-state image sensing device of claim 1, wherein every two of the unit pixels includes a pixel amplifier transistor which reads out the pixel signals accumulated in the corresponding one of the floating diffusion portions, and
each of the floating diffusion portions is electrically connected to a corresponding one of the pixel amplifier transistors.

4. The solid-state image sensing device of claim 3, wherein each of the floating diffusion portions is electrically connected to another one of the floating diffusion portions, said each of the floating diffusion portions and said another one of the floating diffusion portions being adjacent to each other in the row direction, and
each of pairs of the floating diffusion portions electrically connected with each other is electrically connected to a common one of the pixel amplifier transistors.

5. The solid-state image sensing device of claim 3, further comprising a plurality of vertical signal lines each of which is provided for each column and electrically connected to each of the floating diffusion portions via the corresponding one of the pixel amplifier transistors, wherein each of the vertical signal lines receives the pixel signals of the unit pixels arranged in an even-numbered row of a corresponding one of the columns and the pixel signals of the unit pixels arranged in an odd-numbered row of one of the other columns adjacent to said corresponding one of the columns.

6. The solid-state image sensing device of claim 5, further comprising:

a signal processing section which successively reads out the pixel signals from the plurality of vertical signal lines and converts the pixel signals to an image sensing signal of one row; and a horizontal scan circuit which outputs a horizontal drive signal to drive the signal processing section, wherein the horizontal scan circuit outputs the horizontal drive signal which has different timings for a case where the signal processing section reads out the pixel signals of the unit pixels arranged in the even-numbered row and for a case where the signal processing section reads out the pixel signals of the unit pixels arranged in the odd-numbered row.

7. The solid-state image sensing device of claim 6, wherein the horizontal scan circuit includes a plurality of shift register circuits and a selection circuit, the selection circuit selects one of output signals of the plurality of shift register circuits and outputs the selected output signal as the horizontal drive signal, and the shift register circuits generate the output signals being shifted from each other.

8. The solid-state image sensing device of claim 7, further comprising a determination circuit which determines whether the pixel signals read out by the signal processing section are the pixel signals from the unit pixels arranged in the even-numbered row or the pixel signals from the unit pixels arranged in the odd-numbered row to drive the selection circuit.

9. The solid-state image sensing device of claim 6, wherein the horizontal scan circuit includes a shift register circuit which has a plurality of stages of flip-flops serially connected with each other, and the stages of the flip-flops to which a signal is input are different for a case where the signal processing section reads out the pixel signals of the unit pixels arranged in the even-numbered row and for a case where the signal processing section reads out the pixel signals of the unit pixels arranged in the odd-numbered row.

10. The solid-state image sensing device of claim 9, wherein the horizontal scan circuit includes a selection circuit which switches the stages of the flip-flops to which the signal is input.

11. The solid-state image sensing device of claim 10, further comprising a determination circuit which determines whether the pixel signals read out by the signal processing section are the pixel signals from the unit pixels arranged in the even-numbered row or the pixel signals from the unit pixels arranged in the odd-numbered row to drive the selection circuit.

12. The solid-state image sensing device of claim 11, further comprising a vertical scan circuit which outputs a vertical drive signal to bring the plurality of unit pixels into a selected state on a row-by-row basis, wherein the determination circuit operates according to the vertical drive signal.

13. The solid-state image sensing device of claim 6, wherein the horizontal scan circuit includes a shift register circuit which is driven by a shift register drive signal, and the shift register circuit is driven by the shift register drive signal which has different timings for a case where the signal processing section reads out the pixel signals of the unit pixels arranged in the even-numbered row and for a case where the signal processing section reads out the pixel signals of the unit pixels arranged in the odd-numbered row.

* * * * *

UNITED STATES PATENT AND TRADEMARK OFFICE
CERTIFICATE OF CORRECTION

PATENT NO. : 7,728,895 B2  Page 1 of 1
APPLICATION NO. : 11/792856
DATED : June 1, 2010
INVENTOR(S) : Shouzi Tanaka et al.

It is certified that error appears in the above-identified patent and that said Letters Patent is hereby corrected as shown below:

On the title page,
In Item "(86) PCT No.:",
please delete "PCT/JP2006/013790", and insert --PCT/JP2006/313790--.

On the title page,
In Item "(30) Foreign Application Priority Data," please add --JP 2005-373180 December 26, 2005--.

Signed and Sealed this

Ninth Day of November, 2010

David J. Kappos
*Director of the United States Patent and Trademark Office*